(12) United States Patent
Pinarbasi et al.

(10) Patent No.: US 6,315,839 B1
(45) Date of Patent: Nov. 13, 2001

(54) METHOD OF MAKING A KEEPER LAYER FOR A SPIN VALVE SENSOR WITH LOW INTRINSIC ANISOTROPY FIELD

(75) Inventors: Mustafa Pinarbasi, Morgan Hill; Robert Langland Smith, Cupertino, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/176,403

(22) Filed: Oct. 21, 1998

(51) Int. Cl.[7] ..................................................... H01F 10/32
(52) U.S. Cl. .......................................... 148/108; 29/608.03
(58) Field of Search ........................... 148/108; 29/603.08

(56) References Cited

U.S. PATENT DOCUMENTS

| | | | |
|---|---|---|---|
| 5,399,372 | * 3/1995 | Grimes et al. | 427/131 |
| 5,796,561 | * 8/1998 | Mauri | 360/113 |
| 6,085,406 | * 7/2000 | Garfunkel et al. | 29/603.14 |
| 6,178,072 | * 1/2001 | Gill | 360/324.11 |

FOREIGN PATENT DOCUMENTS 5-36033    2/1993   (JP) .

* cited by examiner

Primary Examiner—John Sheehan
(74) Attorney, Agent, or Firm—Gray Cary Ware & Freidenrich; Ervin F. Johnston (57) ABSTRACT

A method of making a keeper layer for a spin valve sensor sputter deposits a layer of cobalt iron niobium hafnium (CoFeNbHf) in the presence of a first magnetic field that is in a first direction, the CoFeNbHf keeper layer is then first annealed in the presence of a second field that is in a second direction and the keeper layer is then subsequently second annealed in the presence of a third field that is in a third direction. The first direction is preferably perpendicular to an air bearing surface of a read head employing the spin valve sensor and the third direction is preferably parallel to the first direction. The second direction is preferably perpendicular to the first direction. This method of making significantly reduces the intrinsic anisotropy ($H_K$) of the keeper layer and also stabilizes the magnetic moment of the keeper layer in a direction which is perpendicular to the ABS.

33 Claims, 7 Drawing Sheets

FIG. 10
(ABS)

FIG. 11
(ABS)

FIG. 12
(ABS)

FIG. 13
(ABS)

FIG. 14
(ABS)

FIG. 18A
(DEPOSIT)

FIG. 18B
(1ST ANNEAL)

FIG. 18C
(2ND ANNEAL)

METHOD OF MAKING A KEEPER LAYER FOR A SPIN VALVE SENSOR WITH LOW INTRINSIC ANISOTROPY FIELD

BACKGROUND OF THE INVENTION

1. Field of the Invention

The present invention relates to a method of making a keeper layer for a spin valve sensor with low intrinsic anisotropy field and more particularly to a method of making a keeper layer that is more reliable for counterbalancing demagnetizing fields and sense current fields on a free layer when a sense current is conducted through multiple layers of the spin valve sensor.

2. Description of the Related Art

A spin valve sensor is employed by a read head for sensing magnetic fields on a moving magnetic medium, such as a rotating magnetic disk or a linearly moving magnetic tape. The sensor includes a nonmagnetic electrically conductive first spacer layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) which is an exposed surface of the sensor that faces the magnetic medium. First and second leads are connected to the spin valve sensor for conducting a sense current therethrough. The magnetic moment of the free layer is free to rotate in positive and negative directions from a quiescent or bias point position in response to positive and negative magnetic fields from a moving magnetic medium. The quiescent position is the position of the magnetic moment of the free layer with the sense current conducted through the sensor and without magnetic field incursions from a rotating magnetic disk. The quiescent position is preferably parallel to the ABS. If the quiescent position of the magnetic moment is not parallel to the ABS when there is no magnetic field incursion from the disk the positive and negative responses of the free layer will not be equal which results in read signal asymmetry which is discussed in more detail hereinbelow.

The thickness of the spacer layer is chosen to be less than the mean free path of electrons conducted through the sensor. With this arrangement, a portion of the conduction electrons are scattered by the interfaces of the spacer layer with the pinned and free layers. When the magnetic moments of the pinned and free layers are parallel with respect to one another scattering is minimal and when their magnetic moments are antiparallel scattering is maximized. Changes in scattering changes the resistance of the spin valve sensor as a function of $\cos \theta$, where $\theta$ is the angle between the magnetic moments of the pinned and free layers. A spin valve sensor has a significantly higher magnetoresistive (MR) coefficient than an anisotropic magnetoresistive (AMR) sensor. For this reason it is sometimes referred to as a giant magnetoresistive (GMR) sensor. Typically, GMR sensors simultaneously display both AMR and GMR effects, so that the output signal is a superposition of their AMR and GMR signals.

The transfer curve (readback signal of the spin valve head versus applied signal from the magnetic disk) of a spin valve sensor is a substantially linear portion of the aforementioned function of $\cos \theta$. The greater this angle, the greater the resistance of the spin valve to the sense current and the greater the readback signal (voltage sensed by processing circuitry). With positive and negative magnetic fields from a rotating magnetic disk (assumed to be equal in magnitude), it is important that positive and negative changes of the magnetoresistance (MR) of the spin valve read head be equal in order that the positive and negative magnitudes of the readback signals are equal. When this occurs a bias point on the transfer curve is considered to be zero and is located midway between the maximum positive and negative readback signals. When the direction of the magnetic moment of the free layer is parallel to the ABS, and the direction of the magnetic moment of the pinned layer is perpendicular to the ABS in a quiescent state (no magnetic field signals from the magnetic disk) the bias point is located at zero and the positive and negative readback signals will be equal when sensing positive and negative magnetic fields from the magnetic disk. The readback signals are then referred to in the art as having symmetry about the zero bias point. When the readback signals are not equal the readback signals are asymmetric.

The location of the bias point on the transfer curve is influenced by five major forces on the free layer, namely a ferromagnetic coupling field ($H_{FC}$) between the pinned layer and the free layer, a demag field ($H_{demag}$) from the pinned layer, demagnetization (demag) field of the free layer acting on itself, sense current fields ($H_{SC}$) from all conductive layers of the spin valve except the free layer, and the superposition of the AMR signal on the GMR signal. The influence of the AMR effect on the bias point is also defined in terms of magnitude and direction.

When the sense current is conducted through the spin valve sensor, the pinning layer (if conductive), the pinned layer and the first spacer layer, which are all on one side of the free layer, impose sense current fields on the free layer that rotate the magnetic moment of the free layer in a first direction. In addition, the pinned layer demagnetization field further rotates it counteracted by a ferromagnetic coupling field $H_{FC}$ imposed by the pinned layer on the free layer. A ferromagnetic keeper layer is employed on an opposite side of the free layer with a nonmagnetic electrically conductive second spacer layer therebetween for imposing both a demagnetizing field and a sense current field on the free layer that is in an opposite direction to the first direction so as to counterbalance the pinned layer demagnetizing field and the sense current fields from the pinning layer, the pinned layer and the first spacer layer.

It is desirable that the keeper layer have a high resistance so that the amount of sense current shunted is small. The keeper layer should also have high magnetic moment to minimize its thickness to reduce current shunting and to fit in the read gap. It is further desirable that the keeper layer have soft magnetic properties (low intrinsic anisotropy) so that when the sense current is conducted through the sensor its magnetic moment will be perpendicular to the ABS in a quiescent state (no field signal from the rotating magnetic disk). Shunted sense current raises the temperature of the sensor which can contribute to instability of the pinning layer and protrusion of alumina layers in the magnetic head. The intrinsic anisotropy ($H_K$) is the amount of applied field required to rotate the magnetic moment of the keeper layer from its easy axis (no applied field) to a position 90° to the easy axis. Low intrinsic anisotropy is desirable so that the magnetic moment of the keeper layer can be easily rotated to the desired direction perpendicular to the ABS should the easy axis of the keeper layer be nonperpendicular to the ABS. Even though the easy axis of the keeper layer may be constructed perpendicular to the ABS an asperity on a rotating magnetic disk or fields from electrical pulses through the sensor, such as electrostatic discharge (ESD) or electrical pickup during manufacture or in the disk drive, can heat the sensor to a temperature in the presence of magnetic field that causes the easy axis to be reoriented nonperpendicular to the ABS. If the keeper layer has a high intrinsic anisotropy the sense current fields from the other conducting layers may not be sufficient to rotate the magnetic moment of the keeper layer to the desired direction perpendicular to the ABS. With high keeper $H_K$ the keeper magnetization can get stuck perpendicular to the ABS in a direction reversed to the desired direction. When the magnetic moment of the keeper layer is not perpendicular to the ABS a component of its demagnetizing field is parallel to the ABS which reduces the counterbalancing effect of the keeper layer.

SUMMARY OF THE INVENTION

A keeper layer made of CoFeNbHf has high resistivity and high magnetic moment and therefore shunts very little of the sense current and functions as an excellent keeper. Unfortunately, however, CoFeNbHf formed by sputtering has a high intrinsic anisotropy which is in the order of 19 Oe. We have found that the intrinsic anisotropy of CoFeNbHf can be reduced to approximately 7 Oe by a three step process. After forming the other layers of the spin valve sensor, including the second spacer layer, a layer of CoFeNbHf is sputtered on the second spacer layer in the presence of a magnetic field that is perpendicular to the ABS. The CoFeNbHf layer is then annealed (i.e. 180° C. for 6 hours) in the presence of a magnetic field that is directed parallel to the ABS. This step reduces the intrinsic anisotropy to about 12 Oe. After the first annealing step the CoFeNbHf layer is annealed a second time (i.e. 180° C. for 6 hours) in the presence of a magnetic field that is in the same direction as the first magnetic field, namely perpendicular to the ABS. The intrinsic anisotropy is then lowered to about 7 Oe.

The construction of a write head on the read head may be employed for the first annealing step. The write head includes a multi-layered insulation stack wherein each layer is baked at a temperature of approximately 180° C. for 6 hours. These baking steps may be employed for the first annealing step of the keeper layer in the presence of the aforementioned magnetic field. Further, a process step employed after construction of the write head for setting the orientation of the magnetic spins of the pinning layer may be employed in the second annealing step of the keeper layer. The pinning layer is reset by annealing (i.e. 180° C.) in the presence of a magnetic field that is perpendicular to the ABS. This same process step may be employed for the aforementioned second annealing of the keeper layer in the presence of a magnetic field.

An object of the present invention is to provide a keeper layer for a spin valve sensor that has a high electrical resistance to sense current, low intrinsic anisotropy ($H_K$) and high magnetic moment.

Another object is to provide keeper and pinned layers that mutually stabilize each other through demagnetizing fields.

A further object is to make a keeper layer that can be reset after it has been disturbed by thermal asperities, ESD events in electronics and unwanted electrical pickup.

Still another object is to provide a CoFeNbHf keeper layer for a spin valve sensor that has low intrinsic anisotropy.

Still a further object is to employ magnetic fields in preselected directions and annealing to lower the intrinsic anisotropy of a sputtered keeper layer.

Still another object is to make a CoFeNbHf keeper layer for a spin valve sensor that has a lower intrinsic anisotropy than that of a CoFeNbHf keeper layer that is simply formed by sputtering.

Other objects and attendant advantages of the invention will be appreciated upon reading the following description taken together with the accompanying drawings.

DESCRIPTION OF THE PREFERRED EMBODIMENT

Magnetic Disk Drive

Figure 1:
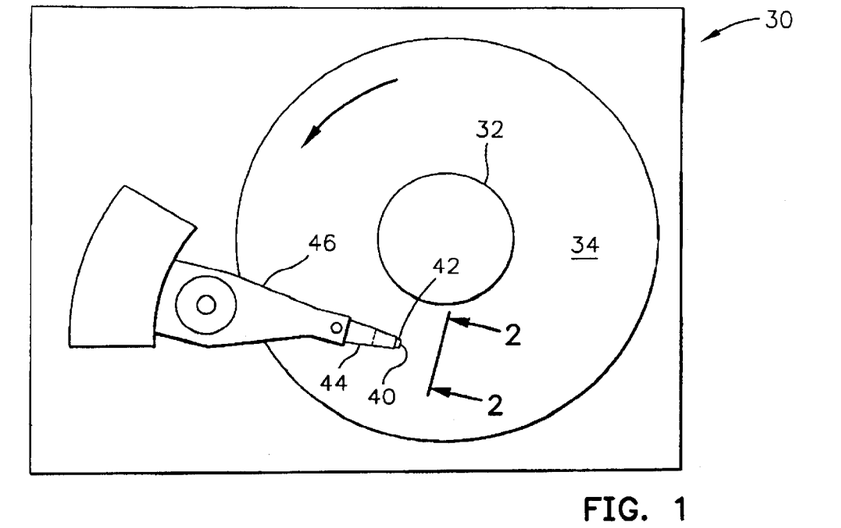
FIG. 1 is a planar view of an exemplary magnetic disk drive.
Figure 2:
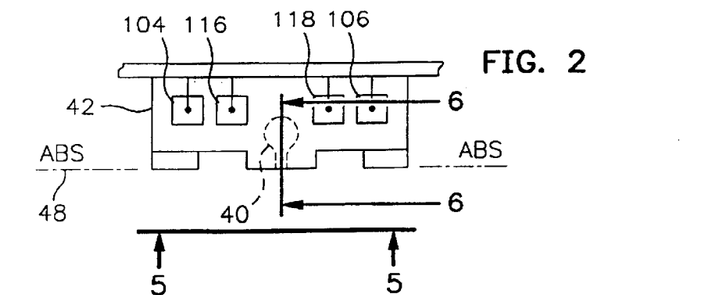
FIG. 2 is an end view of a slider taken along plane 2—2 with a magnetic head shown in hidden lines.
Figure 3:
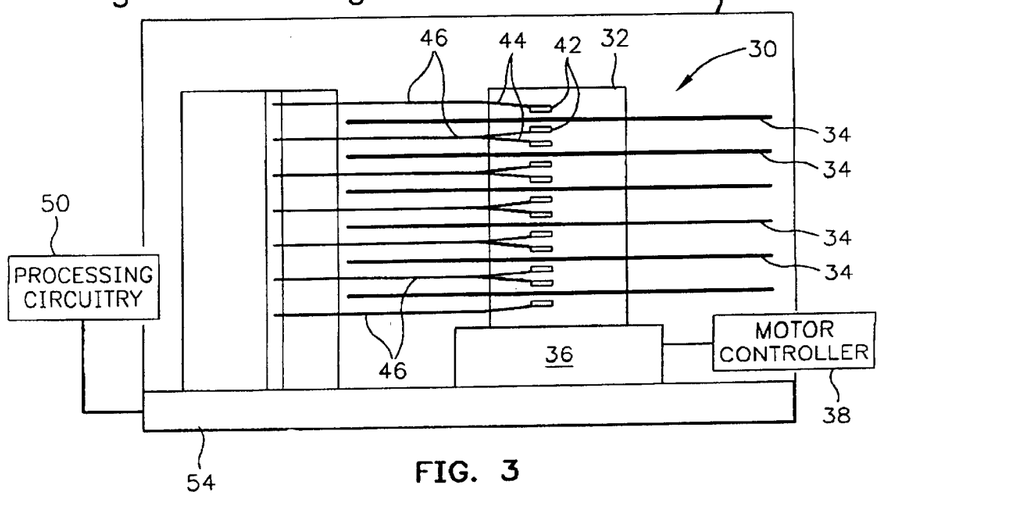
FIG. 3 is an elevation view of the magnetic disk drive wherein multiple disks and magnetic heads are employed.
Figure 4:
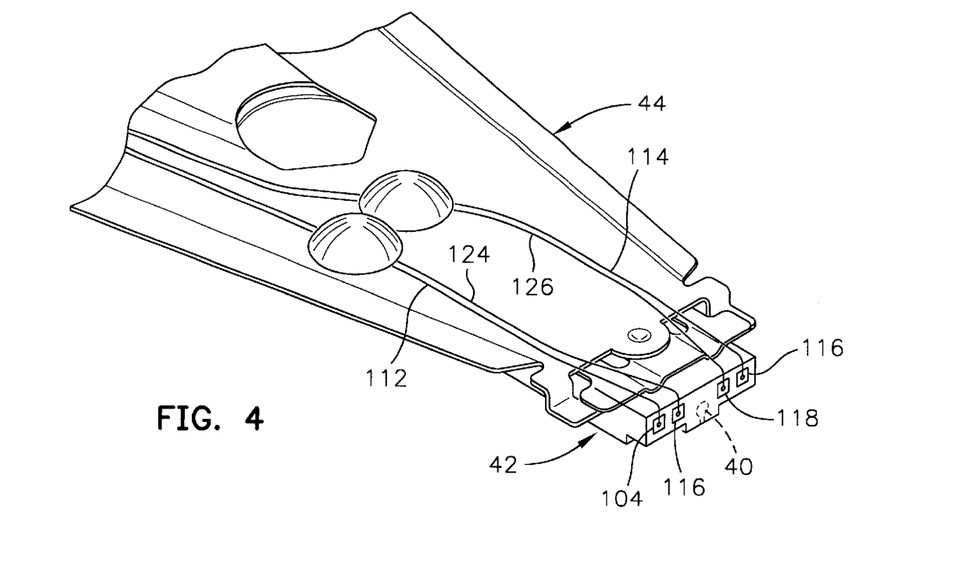
FIG. 4 is an isometric illustration of an exemplary suspension system for supporting the slider and magnetic head.

Referring now to the drawings wherein like reference numerals designate like or similar parts throughout the several views there is illustrated in FIGS. 1–3 a magnetic disk drive 30. The drive 30 includes a spindle 32 that supports and rotates a magnetic disk 34. The spindle 32 is rotated by a motor 36 that is controlled by a motor controller 38. A combined read and write magnetic head 40 is mounted on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically, 0.05 μm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted to the suspension 44. The components described hereinabove may be mounted on a frame 54 of a housing 55, as shown in FIG. 3.

Figure 5:
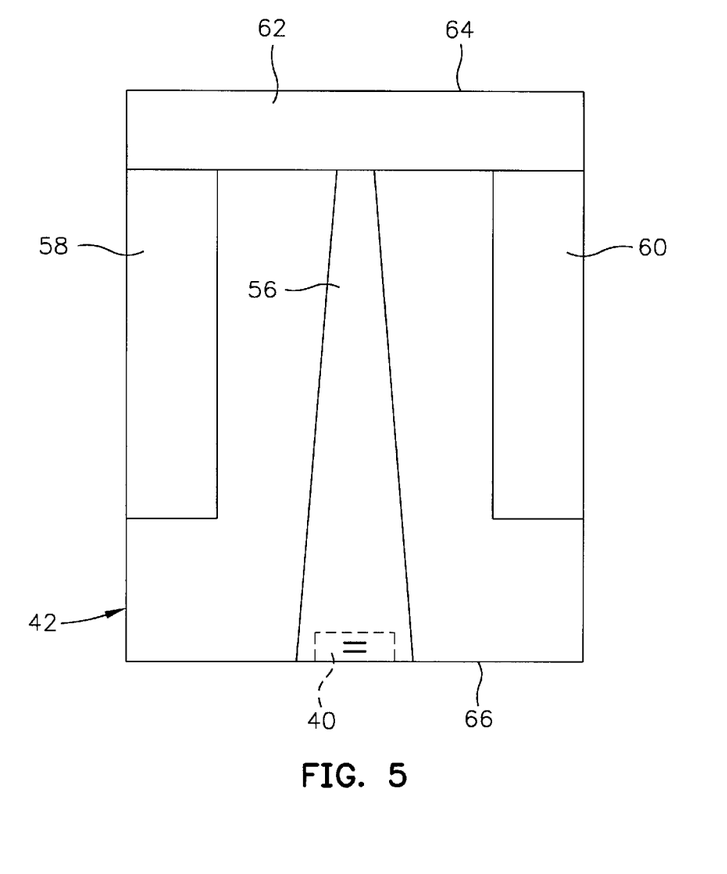
FIG. 5 is an ABS illustration of the slider taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Magnetic Head

Figure 6:
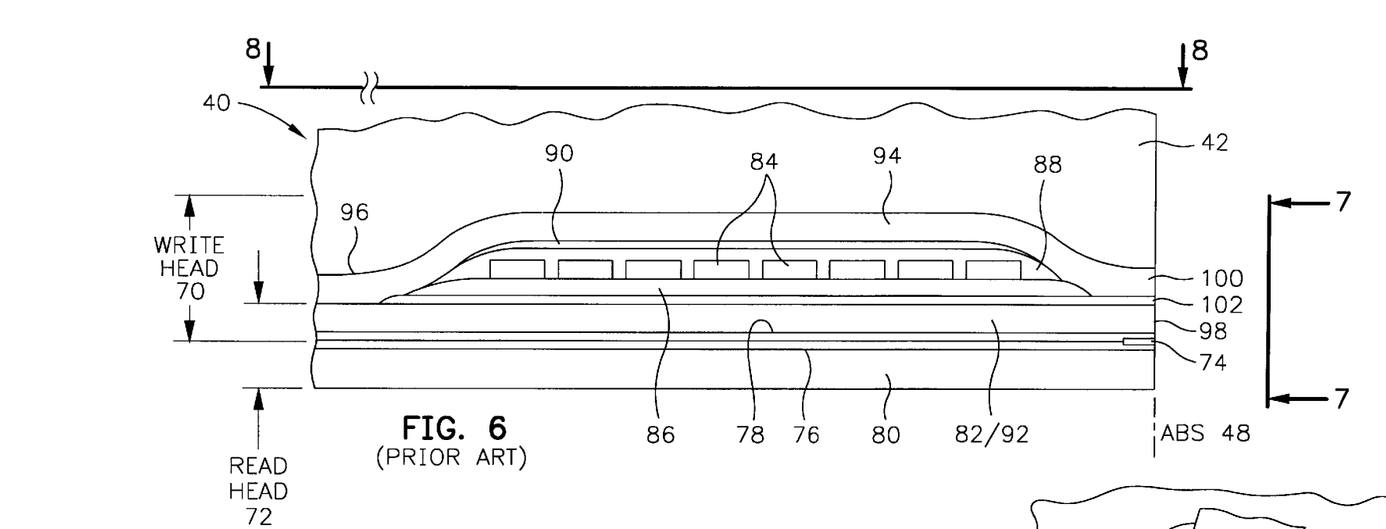
FIG. 6 is a partial elevation view of the slider and magnetic head as seen in plane 6—6 of FIG. 2.
Figure 7:
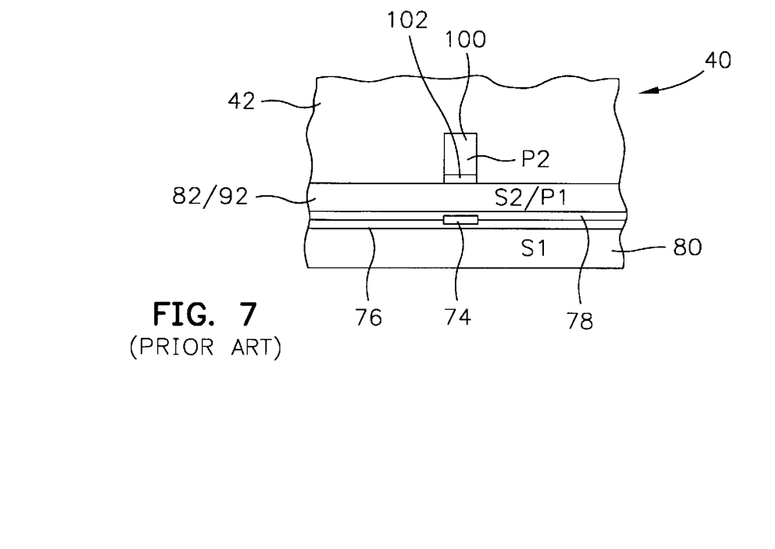
FIG. 7 is a partial ABS view of the slider taken along plane 7—7 of FIG. 6 to show the read and write elements of the magnetic head.

FIG. 6 is a side cross-sectional elevation view of the magnetic head 40 which has a write head portion 70 and a read head portion 72, the read head portion employing a spin valve sensor 74. FIG. 7 is an ABS view of FIG. 6. The sensor 74 is located between first and second gap layers 76 and 78 and the gap layers are located between first and second shield layers 80 and 82. In response to external magnetic fields, the resistance of the sensor 74 changes. A sense current Is (see FIG. 9) conducted through the sensor causes these resistance changes to be manifested as potential changes. These potential changes are then processed as readback signals by the processing circuitry 50 shown in FIG. 3.

Figure 8:
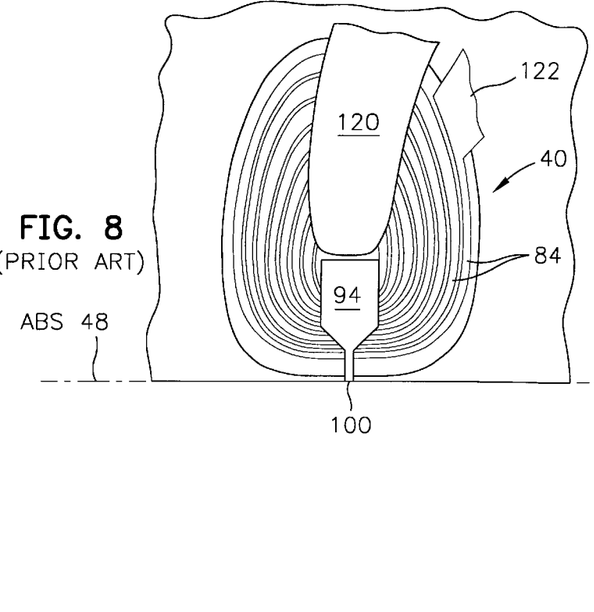
FIG. 8 is a view taken along plane 8—8 of FIG. 6 with all material above the coil layer removed.

The prior art write head portion of the magnetic head includes a coil layer 84 located between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are located between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 116 connect leads from the sensor 74 to leads 112 and 124 on the suspension 44. Third and fourth solder connections 118 and 106 connect leads 120 and 122 from the coil 84 (see FIG. 8) to leads 126 and 114 on the suspension. It should be noted that the magnetic head 40 employs a single layer 82/92 to serve a double function as a second shield layer for the read head and as a first pole piece for the write head. This type of magnetic head is referred to in the art as a "merged head". A piggyback head employs two separate layers for these functions.

Spin Valve Sensor

Figure 9:
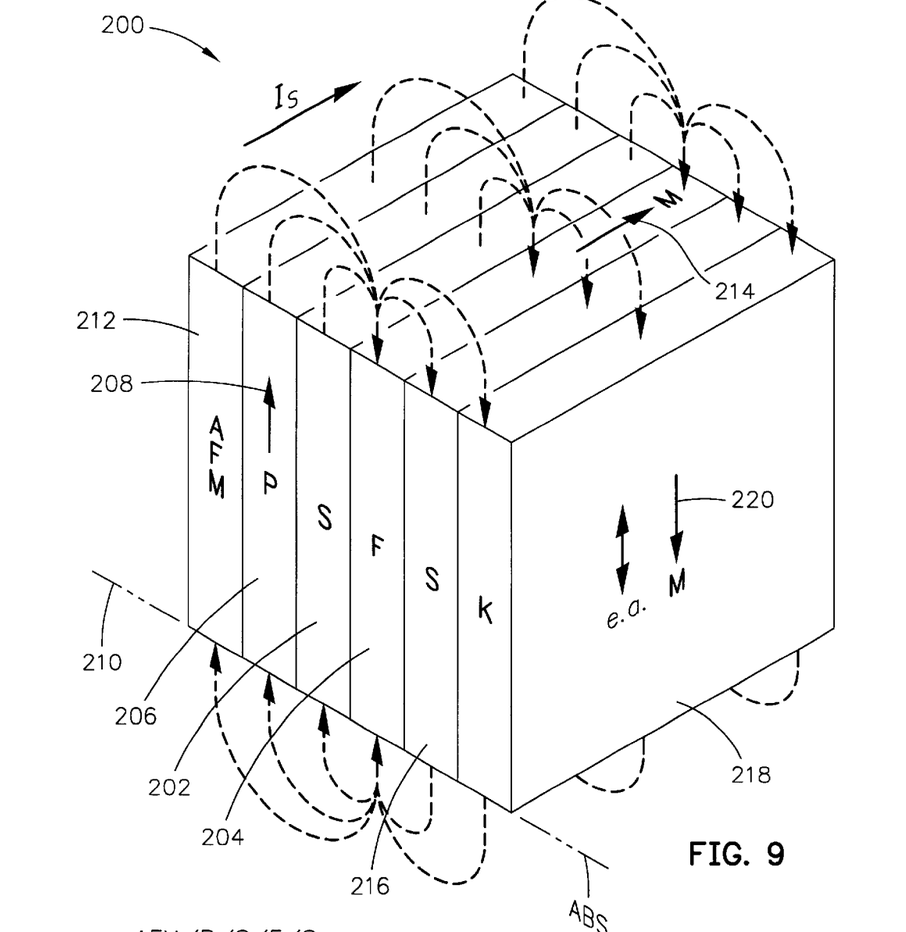
FIG. 9 is a schematic isometric illustration of the present spin valve sensor.

FIG. 9 is an isometric schematic illustration of the present spin valve read head sensor 200 which includes a nonmagnetic electrically conductive spacer layer 202 which is sandwiched between a ferromagnetic free layer 204 and a ferromagnetic pinned layer 206. The pinned layer 206 has a magnetic moment 208 which is preferably pinned perpendicular to the ABS 210 by an antiferromagnetic (AFM) layer 212. In a quiescent state, which is with the sense current Is conducted through the sensor 200 but without any magnetic incursion from a rotating magnetic disk, the magnetic moment 214 of the free layer 204 is preferably nearly parallel to the ABS 210. Accordingly, when positive and negative incursions are imposed on the spin valve sensor 200 the magnetic moment 214 of the free layer rotates upwardly and downwardly respectively from the parallel position shown in FIG. 9. The parallel position of the magnetic moment 214 is generally the zero bias point on the transfer curve of the spin valve sensor and when it is positioned upwardly or downwardly from this parallel position in a quiescent state the bias point of the spin valve sensor is not zero but some value positive or negative with respect to the zero position. When the magnetic moment 214 is in the zero bias position the read signal has symmetry about the bias point, but when the magnetic moment is angled upwardly or downwardly from the parallel position, shown in FIG. 9, the read signal has asymmetry. Accordingly, it is desirable that the magnetic moment 214 of the free layer be located at the zero bias point, which is the parallel position shown in FIG. 9, when the read sensor 214 is in a quiescent state, namely sense current Is on but no magnetic incursion from a rotating magnetic disk.

As stated hereinabove, there are various forces acting on the magnetic moment 214 of the free layer when the spin valve read sensor is in a quiescent state. These forces include a ferromagnetic coupling field between the free layer 204 and the pinned layer 206, a demag field from the pinned layer 206, a demag from the free layer acting on itself, sense current fields when the sense current $I_S$ is conducted through the sensor from all conductive layers of the spin valve except the free layer. The sense current fields from the spacer layer 202, the pinned layer 206 and the AFM layer 212, which is shown by the dashed lines emanating therefrom into the free layer 204 as the sense current is conducted therethrough. The dashed lines indicate which layer is the source of the current fields, which are in the film plane and nearly perpendicular to the sense current ($I_S$).

In the invention a non-magnetic electrically conductive spacer layer 216 is sandwiched between the ferromagnetic free layer 204 and a ferromagnetic keeper layer 218 so that the demagnetizing field of the keeper layer counterbalances or partially counterbalances the pinned layer demagnetization field. When the sense current is conducted through the spin valve sensor the sense current fields from the spacer layer 216 and the keeper layer 218 oppose the sense current fields from the spacer layer 202, the pinned layer 206 and the AFM layer 212, as shown by the dashed lines emanating from the spacer layer 216 and the keeper layer 218 in FIG. 9. Accordingly, the sense current fields from the spacer layer 216 and the keeper layer 218 counterbalance, or at least partially counterbalance, the sense current fields from the spacer layer 202, the pinned layer 206 and the AFM layer 212.

We have found that when the easy axis (e.a.) of the keeper layer is perpendicular to the ABS that the performance of the keeper layer is improved. The easy axis of the keeper layer is bi-directional and encourages the magnetic moment of the keeper layer to be either up or down perpendicular to the ABS as determined by a balance of the sense current fields on the keeper layer from the other layers in the sensor, the demagnetization field from the other layers, and the self-demagnetization field of the keeper layer.

Method of Construction

Figure 10:
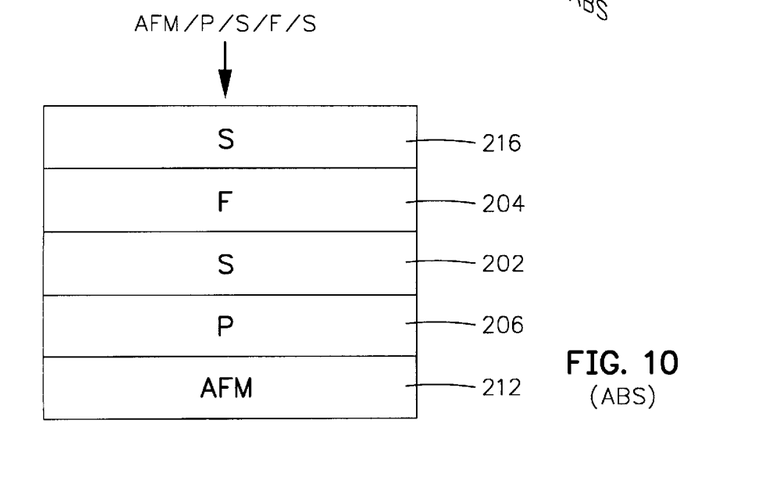
FIG. 10 is an ABS illustration of the deposition of various layers of the present spin valve read head before depositing the keeper layer.

In FIGS. 10–13 we have provided various steps in the construction of the spin valve sensor 200 which not only sets the magnetic moment 220 of the keeper layer in a desired direction perpendicular to the ABS, but also reduces its intrinsic anisotropy ($H_K$) so that the keeper layer is a softer magnetic material for improving its efficiency. Further, we have provided a material for the keeper layer which further enhances its intrinsic anisotropy. FIG. 10 shows the various steps in the construction of the spin valve sensor 200 before the keeper layer 218 is constructed. The AFM layer 212 is sputter deposited on the gap layer 76 (see FIG. 6), the pinned layer 206 is sputter deposited on the AFM layer, the spacer layer 202 is sputter deposited on the pinned layer, the free layer 204 is sputter deposited on the spacer layer and the spacer layer 216 is sputter deposited on the free layer 204. This sputter deposition may take place in a magnetron sputtering chamber.

Figure 11:
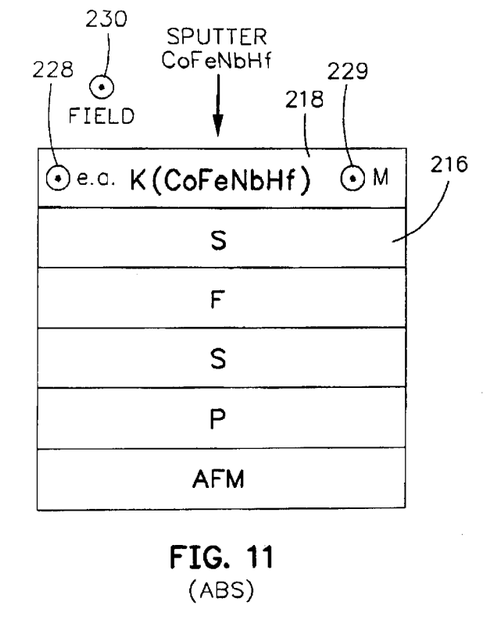
FIG. 11 is the same as FIG. 10 except a keeper layer has been sputter deposited in the presence of a magnetic field in a first direction.
Figure 12:
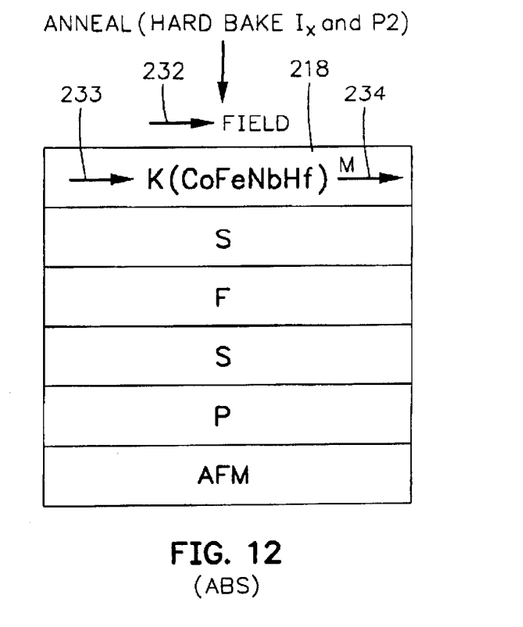
FIG. 12 is the same as FIG. 11 except the spin valve read head is annealed or hard baked in a field which is in a second direction.
Figure 13:
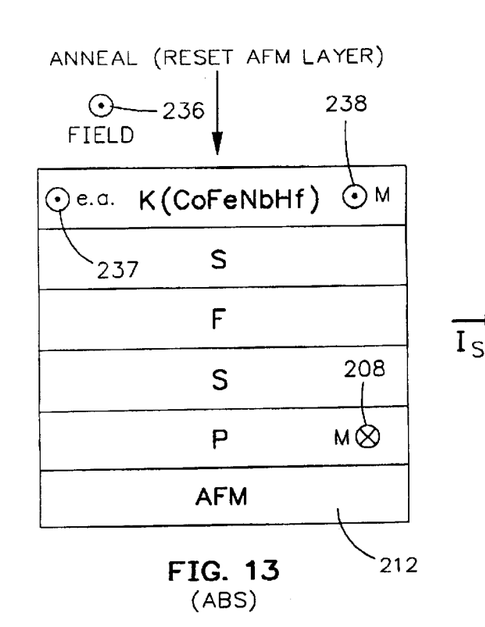
FIG. 13 is the same as FIG. 12 except the spin valve read head is annealed in a magnetic field that is directed in the same direction as the first direction in FIG. 11.
Figure 14:
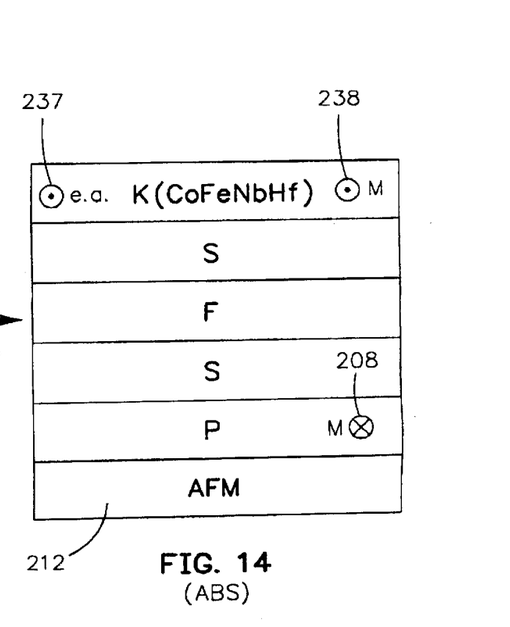
FIG. 14 is an ABS illustration of the spin valve read head shown in FIG. 9.
Figure 15:
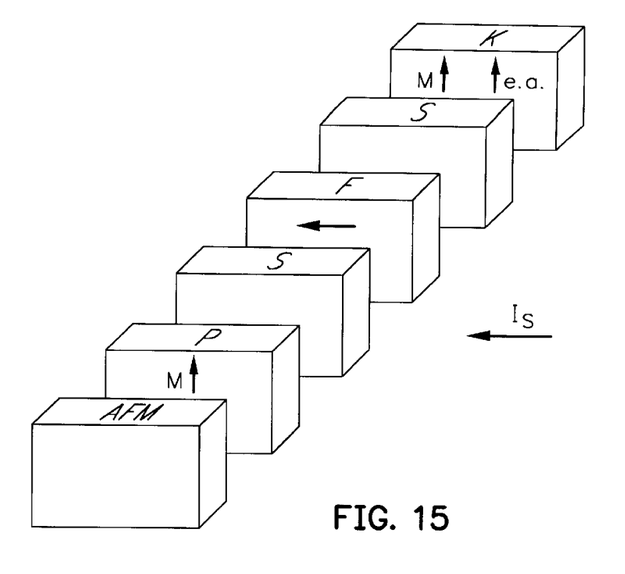
FIG. 15 is an isometric illustration of the embodiment shown in FIG. 14.
Figure 16:
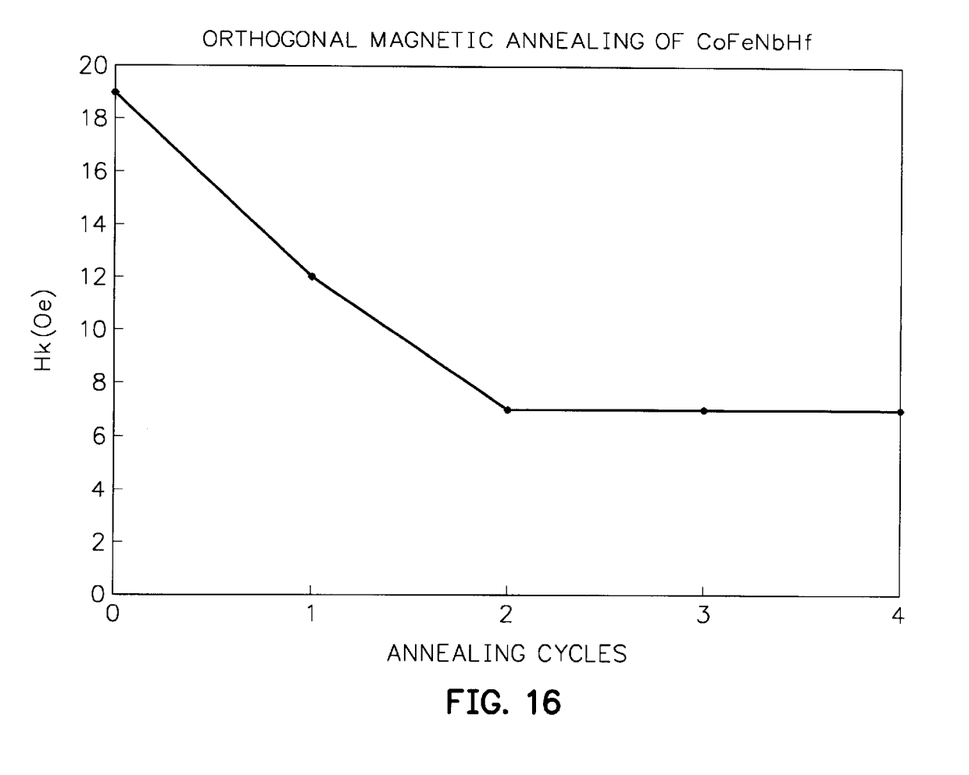
FIG. 16 is a graph of the $H_K$ versus annealing cycles of CoFeNbHf.
Figure 17:
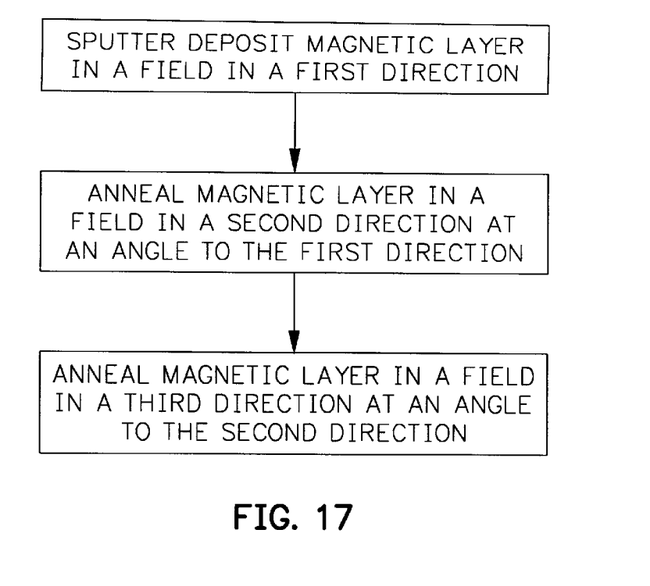
FIG. 17 is a block diagram of steps involving in a broad concept of practicing the invention.
Figure 18A:
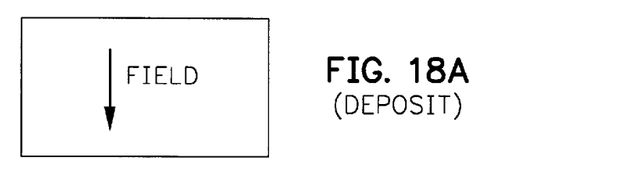
FIGS. 18A, 18B and 18C show schematically the application of the broad concept of FIG. 17 in a preferred embodiment.
Figure 18B:
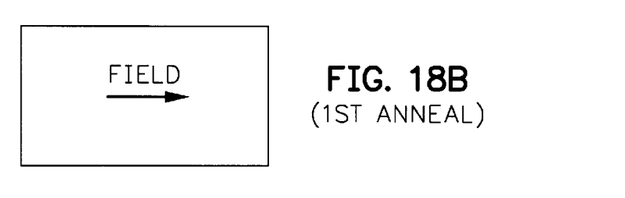
Figure 18C:
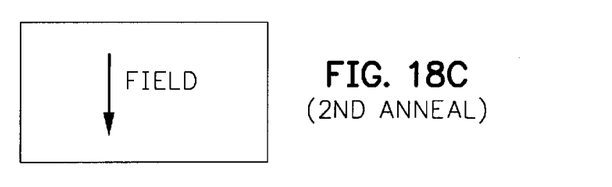

As shown in FIG. 11, the first step in the construction of the keeper layer 218 is to sputter deposit the keeper layer 218 on the spacer layer 216 in a sputtering chamber (not shown) in the presence of a field 230 which is preferably directed perpendicular to the ABS. The direction of the field 230 may be either toward or away from the ABS. At this stage the easy axis 228 and the magnetic moment 229 of the keeper layer are directed perpendicular to the ABS. Next, as shown in FIG. 12, the keeper layer 218 is annealed in a field 232 which is preferably perpendicular to the field 230 and parallel to the ABS. At this stage the directions of the easy axis 233 and the magnetic moment 234 of the keeper layer are reoriented parallel to the ABS. Surprisingly the intrinsic anisotropy of the keeper layer was reduced after the annealing step in FIG. 12, as will be discussed hereinafter. Next, the keeper layer 218 is annealed once again in the presence of a field 236 which is preferably parallel to the field 230 shown in FIG. 11 and perpendicular to the ABS. This reorients the directions of the easy axis 237 and the magnetic moment 238 of the keeper layer once again perpendicular to the ABS. Surprisingly the annealing step in FIG. 13 still further reduced the intrinsic anisotropy ($H_K$) of the keeper layer shown in FIG. 12, as will be discussed hereinafter. FIGS. 14 and 15 are illustrations of the completed spin valve sensor, according to the invention, with the sense current $I_S$ being conducted therethrough as shown in FIG. 9. FIG. 16 shows that replicating the annealing cycles after the second annealing cycle does not lower the $H_K$.

The preferred material for the keeper layer 218 is cobalt, iron, niobium and hafnium (CoFeNbHf). The properties of CoFeNbHf are a magnetic saturation (Ms) of 1000 emu/cc, a resistivity of 100 Ωcm, $H_K$ of 15–18 Oe and coercivity ($H_C$) of 1 Oe. When this material was employed we found that the intrinsic anisotropy ($H_K$) of the keeper layer 218 after the sputter deposition in FIG. 11 was 19 Oe and that the intrinsic anisotropy of the keeper layer 218 after the annealing in FIG. 12 was 12 Oe. This was a reduction in intrinsic anisotropy of 7 Oe. We further found that, when this material was used, the intrinsic anisotropy of the keeper layer after the annealing step in FIG. 13 was still further reduced to 7 Oe. Accordingly, the total reduction in intrinsic anisotropy ($H_K$) of the keeper layer was 12 Oe. This significantly improved the soft magnetic properties of the keeper layer thereby ensuring its orientation perpendicular to the ABS when the sense current $I_S$ is conducted through the spin valve sensor. Further, the method shown in FIGS. 11–13 set the easy axis of the magnetic moment 238 of the keeper layer perpendicular to the ABS which is the preferred position. We found that this positioning is easily obtainable after the annealing shown in FIG. 12 since the original direction or easy axis of the magnetic moment 228 after the step in FIG. 11 is in the same direction.

In a preferred embodiment the annealing shown in FIG. 12 is accomplished simultaneously with the hard baking of the insulation layers 86, 88 and 90 shown in FIG. 6. Accordingly, the preferred annealing in FIG. 12 is 225° C. for 10 hours, which is employed in a typical hard bake of the insulation layers of the write head. However, the annealing temperature can be between 190° C. to 250° C. for 6–12 hours. Still further, in a preferred embodiment the annealing shown in FIG. 13 is accomplished simultaneously with the resetting of the magnetic spins of the AFM layer 212. This resetting is typically 200° C. to 250° C. for 10 minutes. The resetting of the AFM layer 212 then pins the magnetic moment 208 of the pinned layer as shown in FIGS. 9 and 13.

Typical materials for the various layers are nickel oxide (NiO) for the AFM layer 212, Permalloy ($Ni_{80}Fe_{20}$) for the pinned layer 206, copper (Cu) for the spacer layer 202, Permalloy for the free layer 204 and copper for the spacer layer 216.

FIGS. 17 and 18A, 18B and 18C explain a broad concept of the present invention. The invention may be used for other magnetic layers and the directions of the magnetic fields may be other than that shown in FIGS. 11–13. Accordingly, a magnetic layer may be sputter deposited in a field that is in a first direction. This direction may be perpendicular to the ABS or at some other angle thereto. Next, the magnetic layer is annealed in a field that is in a second direction which is at an angle to the first direction. The second direction may be perpendicular to the first direction or at some other angle thereto. If desired, the process may be terminated at this point with the second direction being the desired direction of the magnetic moment of the magnetic layer. It should be noted that at this stage the intrinsic anisotropy ($H_K$) of the magnetic layer has been reduced as discussed hereinabove. Preferably, however, the magnetic layer is annealed a second time in a field that is in a third direction which is at an angle to the second direction. Preferably, the third direction is parallel to the first direction, however, it may be at some angle thereto. In any event the intrinsic anisotropy ($H_K$) of the magnetic layer will be still further reduced after the second annealing.

Clearly, other embodiments and modifications of this invention will occur readily to those of ordinary skill in the art in view of these teachings. Therefore, this invention is to be limited only by following claims, which include all such embodiments and modifications when viewed in conjunction with the above specification and accompanying drawings.

We claim:

1. A method of making a keeper layer for a spin valve sensor wherein the spin valve sensor includes a first spacer layer between a free layer and a pinned layer and a second spacer layer between the free layer and the keeper layer so that a demagnetization field from the keeper layer opposes a demagnetization field from the pinned layer and so that when a sense current field is conducted through the sensor a sense current field from the keeper layer opposes a sense current field from the pinned layer, the method comprising:
   sputter depositing a CoFeNbHf keeper layer on the second spacer layer in the presence of a first magnetic field that is in a first direction; and
   first annealing the CoFeNbHf keeper layer in the presence of a second field that is in a second direction.

2. A method as claimed in claim 1 wherein the second direction is orthogonal to the first direction.

3. A method as claimed in claim 1 wherein said annealing is a temperature of 190° C. to 250° C. for 6–12 hours.

4. A method as claimed in claim 1 further including:
   second annealing the CoFeNbHf layer in the presence of a third field that is in a third direction.

5. A method as claimed in claim 4 wherein said annealing is a temperature of 190° C. to 250° C. for 6–12 hours.

6. A method as claimed in claim 5 wherein said annealing is at a temperature of 225° C. for 10 hours.

7. A method as claimed in claim 4 wherein the first and third directions are orthogonal to the second direction.

8. A method as claimed in claim 7 wherein said annealing is a temperature of 190° C. to 250° C. for 6–12 hours.

9. A method as claimed in claim 7 wherein the first direction is perpendicular to the ABS.

10. A method as claimed in claim 9 wherein said annealing is a temperature of 190° C. to 250° C. for 6–12 hours.

11. A method as claimed in claim 10 wherein said annealing is at a temperature of 225° C. for 10 hours.

12. A method of making a magnetic head comprising the steps of:

forming an antiferromagnetic layer;

forming a ferromagnetic pinning layer on the antiferromagnetic layer;

forming a nonmagnetic electrically conductive first spacer layer on the ferromagnetic pinning layer;

forming a ferromagnetic free layer on the first spacer layer;

forming a nonmagnetic electrically conductive second spacer layer on the free layer;

sputter depositing a ferromagnetic keeper layer on the second spacer layer in the presence of a magnetic field in a first direction; and first annealing the keeper layer in the presence of a second field that is in a second direction.

13. A method as claimed in claim 12 wherein the second direction is orthogonal to the first direction.

14. A method as claimed in claim 13 further including:

before forming the pinning layer forming a ferromagnetic first shield layer and forming a first nonmagnetic nonconductive first gap layer on the first shield layer;

forming said pinning layer on the first gap layer;

forming first and second lead layers on the first gap layer and connecting them to the pinning, pinned, spacer and keeper layers;

forming a nonmagnetic nonconductive second gap layer on the keeper, lead and first gap layers;

forming a ferromagnetic second shield and first pole piece layer on the second gap layer;

forming a nonmagnetic write gap layer on the second shield and first pole piece layer in a pole tip region;

forming a multilayered insulation stack with an electrically conductive coil layer embedded therein on the second shield and first pole piece layer in a yoke region;

the forming of the multilayered insulation stack comprising hard baking each layer of the insulation stack; and forming a second pole piece layer on the gap layer in the pole tip region, on the insulation stack in the yoke region and connected to the second shield and first pole piece layer at a back gap.

15. A method as claimed in claim 14 wherein the hard baking of the layers of the insulation stack is employed for said first annealing the keeper layer.

16. A method as claimed in claim 12 further including:

second annealing the keeper layer in the presence of a third field that is in a third direction.

17. A method as claimed in claim 16 wherein the first and third directions are orthogonal to the second direction.

18. A method as claimed in claim 17 wherein the first direction is perpendicular to the ABS.

19. A method as claimed in maim 18 further including:

before forming the pinning layer forming a ferromagnetic first shield layer and forming a first nonmagnetic nonconductive first gap layer on the first shield layer;

forming said pinning layer on the first gap layer;

forming first and second lead layers on the first gap layer and connecting them to the pinning, pinned, spacer and keeper layers;

forming a nonmagnetic nonconductive second gap layer on the keeper, lead and first gap layers;

forming a ferromagnetic second shield and first pole piece layer on the second gap layer;

forming a nonmagnetic write gap layer on the second shield and first pole piece layer in a pole tip region;

forming a multilayered insulation stack with an electrically conductive coil layer embedded therein on the second shield and first pole piece layer in a yoke region;

the forming of the multilayered insulation stack comprising hard baking each layer of the insulation stack; and forming a second pole piece layer on the gap layer in the pole tip region, on the insulation stack in the yoke region and connected to the second shield and first pole piece layer at a back gap.

20. A method as claimed in claim 19 wherein the hard baking of the layers of the insulation stack is employed for said first annealing the keeper layer.

21. A method as claimed in claim 20 including:

after forming the second pole piece layer, said second annealing the pinning layer in the presence of the magnetic field that is directed in said third direction.

22. A method as claimed in claim 21 wherein said second annealing the pinning layer in the presence of the magnetic field that is directed in said third direction is also employed for resetting magnetic spins of the pinning layer.

23. A method as claimed in claim 12 wherein the keeper layer is CoFeNbHf.

24. A method as claimed in claim 23 wherein the second direction is orthogonal to the first direction.

25. A method as claimed in claim 24 further including:

before forming the pinning layer forming a ferromagnetic first shield layer and forming a first nonmagnetic nonconductive first gap layer on the first shield layer;

forming said pinning layer on the first gap layer;

forming first and second lead layers on the first gap layer and connecting them to the pinning, pinned, spacer and keeper layers;

forming a nonmagnetic nonconductive second gap layer on the keeper, lead and first gap layers;

forming a ferromagnetic second shield and first pole piece layer on the second gap layer;

forming a nonmagnetic write gap layer on the second shield and first pole piece layer in a pole tip region;

forming a multilayered insulation stack with an electrically conductive coil layer embedded therein on the second shield and first pole piece layer in a yoke region;

the forming of the multilayered insulation stack comprising hard baking each layer of the insulation stack; and forming a second pole piece layer on the gap layer in the pole tip region, on the insulation stack in the yoke region and connected to the second shield and first pole piece layer at a back gap.

26. A method as claimed in claim 25 wherein the hard baking of the layers of the insulation stack is employed for said first annealing the keeper layer.

27. A method as claimed in claim 23 further including:

second annealing the CoFeNbHf layer in the presence of a third field that is in a third direction.

28. A method as claimed in claim 27 wherein the first and third directions are orthogonal to the second direction.

29. A method as claimed in claim 28 wherein the first direction is perpendicular to the ABS.

30. A method as claimed in claim 29 further including:
before forming the pinning layer forming a ferromagnetic first shield layer and forming a first nonmagnetic nonconductive first gap layer on the first shield layer;
forming said pinning layer on the first gap layer;
forming first and second lead layers on the first gap layer and connecting them to the pinning, pinned, spacer and keeper layers;
forming a nonmagnetic nonconductive second gap layer on the keeper, lead and first gap layers;
forming a ferromagnetic second shield and first pole piece layer on the second gap layer;
forming a nonmagnetic write gap layer on the second shield and first pole piece layer in a pole tip region;
forming a multilayered insulation stack with an electrically conductive coil layer embedded therein on the second shield and first pole piece layer in a yoke region;
the forming of the multilayered insulation stack Comprising hard baking each layer of the insulation stack; and
forming a second pole piece layer on the gap layer in the pole tip region, on the insulation stack in the yoke region and connected-to the second shield and first pole piece layer at a back gap.

31. A method as claimed in claim 30 wherein the hard baking of the layers of the insulation stack is employed for said first annealing the keeper layer.

32. A method as claimed in claim 31 including:
after forming the second pole piece layer, said second annealing the pinning layer in the presence of the magnetic field that is directed in said third direction.

33. A method as claimed in claim 32 wherein said second annealing the pinning layer in the presence of the magnetic field that is directed in said third direction is also employed for resetting magnetic spins of the pinning layer.

* * * * *